United States Patent
Horng et al.

(10) Patent No.: US 11,589,488 B1
(45) Date of Patent: Feb. 21, 2023

(54) WARPAGE SUPPRESSING REFLOW OVEN

(71) Applicant: ABLEPRINT TECHNOLOGY CO., LTD., Miaoli County (TW)

(72) Inventors: Chih-Horng Horng, Hsinchu (TW); Hsu-Wen Wu, Kaohsiung (TW); Chi-Chieh Lai, Taichung (TW)

(73) Assignee: ABLEPRINT IECHNOLOGY CO., LTD., Miaoli County (TW)

( * ) Notice: Subject to any disclaimer, the term of this patent is extended or adjusted under 35 U.S.C. 154(b) by 0 days.

(21) Appl. No.: 17/547,326

(22) Filed: Dec. 10, 2021

(30) Foreign Application Priority Data

Jul. 28, 2021 (TW) ................. 110127665

(51) Int. Cl.
| | |
|---|---|
| *B23K 1/00* | (2006.01) |
| *H05K 13/00* | (2006.01) |
| *H05K 13/04* | (2006.01) |
| *B23K 3/08* | (2006.01) |
| *B23K 37/04* | (2006.01) |
| *B23K 1/008* | (2006.01) |
| *B23K 101/42* | (2006.01) |

(52) U.S. Cl.
CPC ......... *H05K 13/0069* (2013.01); *B23K 1/008* (2013.01); *B23K 3/087* (2013.01); *B23K 37/0408* (2013.01); *H05K 13/0465* (2013.01); *B23K 2101/42* (2018.08)

(58) Field of Classification Search
CPC ........... H05K 13/0069; H05K 13/0465; B23K 1/008; B23K 3/087; B23K 37/0408; B23K 2101/42
See application file for complete search history.

(56) References Cited

U.S. PATENT DOCUMENTS

| | | | | |
|---|---|---|---|---|
| 7,560,064 | B1 * | 7/2009 | Crees ..................... | B23K 10/00 |
| | | | | 266/49 |
| 2017/0005063 | A1 * | 1/2017 | Kang ................... | B23K 1/0016 |

FOREIGN PATENT DOCUMENTS

| | | | | | |
|---|---|---|---|---|---|
| CN | 105082735 | A | * | 11/2015 | .......... B41F 15/0818 |
| CN | 205166094 | U | * | 4/2016 | |
| CN | 205464672 | U | * | 8/2016 | |
| CN | 206196161 | U | * | 5/2017 | |
| CN | 206196162 | U | * | 5/2017 | |
| CN | 206196164 | U | * | 5/2017 | |
| CN | 107081497 | A | * | 8/2017 | |
| CN | 108200732 | A | * | 6/2018 | ............... B23K 3/00 |
| CN | 207592991 | U | * | 7/2018 | |
| CN | 207888018 | U | * | 9/2018 | ........... B23K 1/0016 |

(Continued)

*Primary Examiner* — Kiley S Stoner (57) ABSTRACT

Disclosed is a warpage suppressing reflow oven, which comprises a reflow oven body, where a perforated steel plate circulating device comprising a perforated steel plate is disposed at a reflow-oven inner oven. A plurality of downdraft modules is arranged in the perforated steel plate, and the downdraft acting forces thereof face the upper panel. More than one air extractor is communicated with the plurality of downdraft modules via a plurality of pipelines. Under actuation of the air extractors, the downdraft modules generate downdraft acting forces to the bottom surfaces of the products, so that the products are flatly attached to the universal perforated carriers without warpage in a heat soldering process. Thereby, more uniform heating of the products and better contact of solder joints and effectively improving the yield of reflow soldering operations are achieved.

10 Claims, 9 Drawing Sheets

(56) References Cited

FOREIGN PATENT DOCUMENTS

| | | | | | |
|---|---|---|---|---|---|
| CN | 207911144 | U | * | 9/2018 | ............... B23K 3/00 |
| CN | 209322982 | U | * | 8/2019 | |
| CN | 110355440 | A | * | 10/2019 | ............ B23K 1/008 |
| CN | 110519940 | A | * | 11/2019 | |
| CN | 209647790 | U | * | 11/2019 | |
| CN | 111673223 | A | * | 9/2020 | |
| CN | 112077411 | A | * | 12/2020 | |
| CN | 112077412 | A | * | 12/2020 | |
| CN | 212286195 | U | * | 1/2021 | |
| CN | 112437601 | A | * | 3/2021 | |
| CN | 212682730 | U | * | 3/2021 | |
| CN | 112872522 | A | * | 6/2021 | |
| CN | 113000971 | A | * | 6/2021 | ............... B23K 3/00 |
| CN | 213560397 | U | * | 6/2021 | |
| CN | 213984522 | U | * | 8/2021 | |
| CN | 114669822 | A | * | 6/2022 | |
| CN | 216966558 | U | * | 7/2022 | |
| JP | H0481269 | A | * | 3/1992 | |
| JP | 2010278250 | A | * | 12/2010 | ............. H01L 24/97 |
| JP | 2012134189 | A | * | 7/2012 | |
| JP | 2014150122 | A | * | 8/2014 | |
| JP | 2020004827 | A | * | 1/2020 | ........... B23K 1/0016 |
| KR | 20160093745 | A | * | 8/2016 | |
| WO | WO-2022102156 | A1 | * | 5/2022 | |

\* cited by examiner

WARPAGE SUPPRESSING REFLOW OVEN

CROSS REFERENCE TO RELATED APPLICATIONS

The present application claims the benefit of Taiwanese Patent Application No. 110127665 filed on Jul. 28, 2021, the contents of which are incorporated herein by reference in their entirety.

BACKGROUND OF THE INVENTION

1. Field of the Invention

The present invention belongs to the technical field of reflow ovens, and more particularly, technically provides a warpage suppressing reflow oven, which is equipped with a plurality of downdraft modules that cooperate with air extractors and pipelines to generate downdraft acting forces; and the downdraft acting forces are transferred to the bottom surfaces of moving products, so that the products are flatly attached to universal perforated carriers for soldering without deformation, thereby avoiding soldering defects caused by deformation.

2. Description of the Related Art

The booming development of the electronics industry is largely because of the contributions made by the development and precision of the SMD (Surface Mounted Device) technology, and reflow soldering is one of the most important technologies in the SMD technology. It is known that the reflow soldering is soldering by heating of a reflow oven. The reflow oven is a heating oven. When a circuit board equipped with electronic elements is carried into the oven by a carrying device formed by a chain conveyor, through heating by spraying hot air and the like, soldering tin is molten for soldering of the circuit board and the electronic elements. When the products of the reflow oven such as carrier plates like PCB (Printed circuit board) deform due to the temperature, follow-up soldering operations often result in poor soldering. Moreover, since the carrier plates like PCB are made even thinner, the problem of deformation of the carrier plates like PCB happens more frequently due to the high temperature. Therefore, it is very important to control the carrier plates like PCB to avoid deformation during the reflow soldering. To address the problem, the prior art utilizes a pressure difference caused by unequal air speeds above and below a chain belt to press the carrier plates so as to flatten the warping carrier plate. But the force of such pressure difference may be too small for some carrier plates that are relatively hard or warp excessively (a large pressure difference may lead to a high air speed and thus influence the product quality), and consequently, a tin ball below a wafer does not contact well with the tin or golden finger on the carrier plate, causing a loss in yield in reflow soldering operations (false soldering or failure in contact with melting bridging due to warpage). So, it is really necessary to improve the prior art.

Therefore, with respect to the problems of the known reflow oven structure, to develop a more ideal and practical innovative structure is an urgent hope of consumers as well as the target and direction that relevant practitioners must strive to achieve and follow through research and development.

In view of this, based on the inventor's years of experiences in the manufacturing processes of relevant products as well as in equipment development and design, and through detailed design and prudent assessment regarding the target, the present invention with real practicability is obtained finally.

SUMMARY OF THE INVENTION

A main objective of the present invention is to provide a warpage suppressing reflow oven, which is equipped with a plurality of downdraft modules that cooperate with air extractors and pipelines to generate downdraft acting forces; the downdraft acting forces are transferred to the bottom surfaces of moving products, so that the products are flatly attached to universal perforated carriers for soldering without deformation, thereby avoiding soldering defects caused by deformation.

To achieve the objective, the present invention provides a warpage suppressing reflow oven, which includes a reflow oven body, where a reflow-oven inner oven is disposed in the reflow oven body; an openable reflow-oven upper oven is disposed on the reflow oven body; the reflow oven is divided into a preheating area, a reflow soldering area and a cooling area; primarily, a perforated steel plate circulating device is disposed at the reflow-oven inner oven; the perforated steel plate circulating device includes a perforated steel plate; the length of the perforated steel plate is determined by the number of heating and cooling areas; the perforated steel plate is looped to form an upper panel and a lower panel; a plurality of downdraft modules are arranged in the perforated steel plate; the number of the downdraft modules is determined according to the required number of heating and cooling areas of the reflow oven; the downdraft modules can generate downdraft acting forces toward the upper panel of the moving perforated steel plate; more than one air extractor is communicated with the plurality of downdraft modules via a plurality of pipelines; accordingly, a plurality of products and a plurality of universal perforated carriers are arranged on the upper panel of the perforated steel plate; and the universal perforated carriers do not need to be replaced for different arrangements of the products. Under actuation of the air extractors, the downdraft modules generate downdraft acting forces; and the downdraft acting forces reach the bottom surfaces of the products via the moving steel plate holes and carrier holes, so that the products are flatly attached to the universal perforated carriers without warpage in a heat soldering process, thereby achieving more uniform heating of the products and effectively improving the yield of reflow soldering operations.

In the warpage suppressing reflow oven, more than one independent compartment is disposed in the downdraft module; and the more than one independent compartment is respectively communicated with corresponding one of the pipelines.

In the warpage suppressing reflow oven, an in-built plate is sealed above the independent compartments of the downdraft module; a plurality of through holes are made in the in-built plate; an outer panel is fixed above the in-built plate; a plurality of through plate holes are made in the outer panel; and the plate holes, the through holes and the independent compartments are communicated with each other.

In the warpage suppressing reflow oven, at least one heater is disposed in the independent compartment of the downdraft module, so as to ensure that the in-built plate and the outer panel are maintained above certain temperature.

In the warpage suppressing reflow oven, at least one filter and at least one sensor are disposed between the downdraft module and the air extractor, so as to ensure that the pipelines connecting the downdraft module and the air extractor are unblocked to maintain a product adsorption capacity.

In the warpage suppressing reflow oven, the sensor can be a flowmeter or a pressure gauge; the flowmeter is used for sensing a gas flow change of the pipelines; or the pressure gauge is used for sensing a gas pressure change of the pipelines.

In the warpage suppressing reflow oven, at least one dust collector is disposed on the inner side of the perforated steel plate circulating device.

The technologies, means and effects of the present invention are described hereafter in detail using a preferred embodiment and in combination with drawings; and it is believed that the purposes, structures and characteristics of the present invention can thus be understood deeply and specifically.

DETAILED DESCRIPTION OF THE PREFERRED EMBODIMENTS

The present invention provides a warpage suppressing reflow oven.

Figure 1:
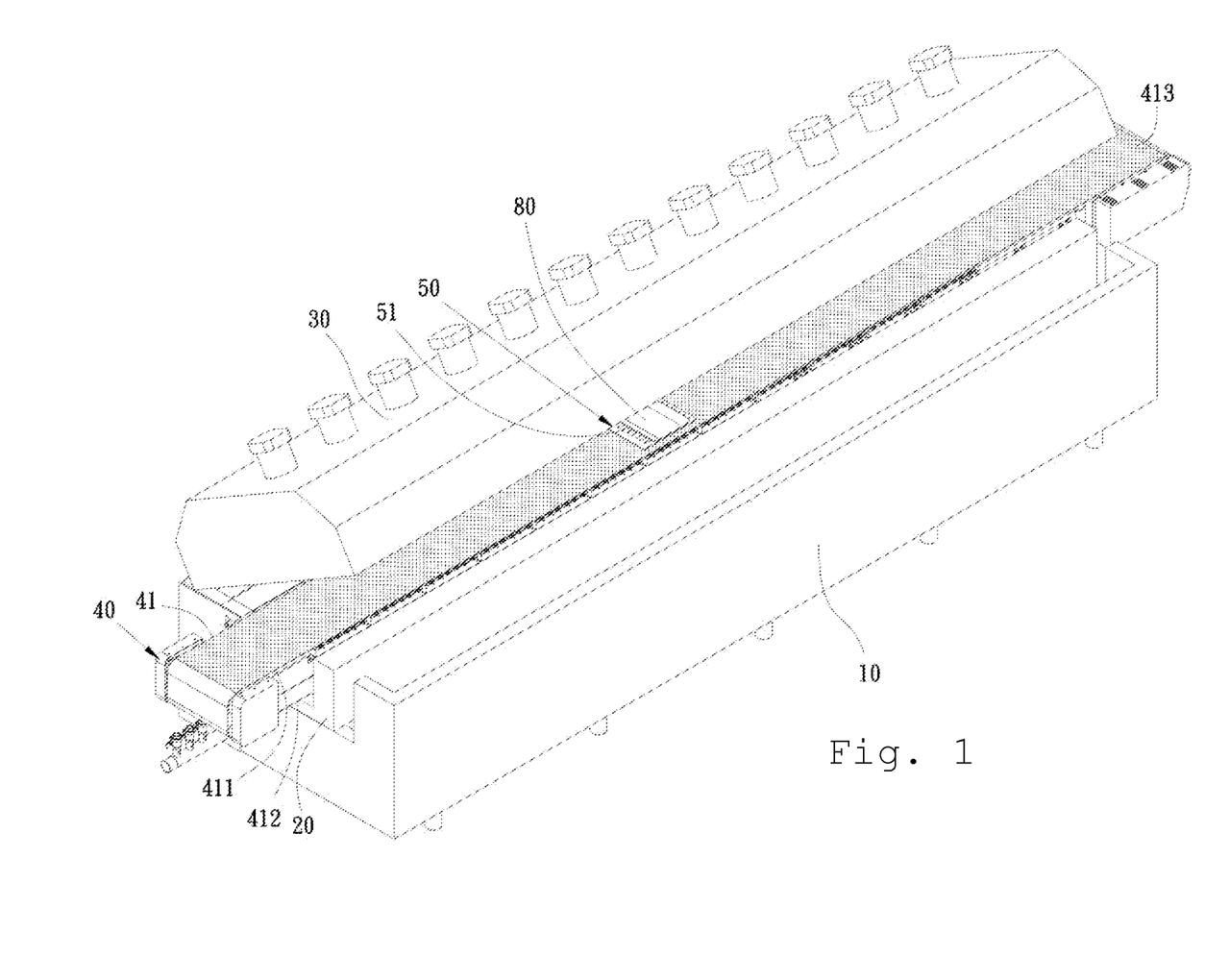
FIG. 1 is a stereoscopic diagram of the open state of the upper oven of an embodiment of the present invention.
Figure 2:
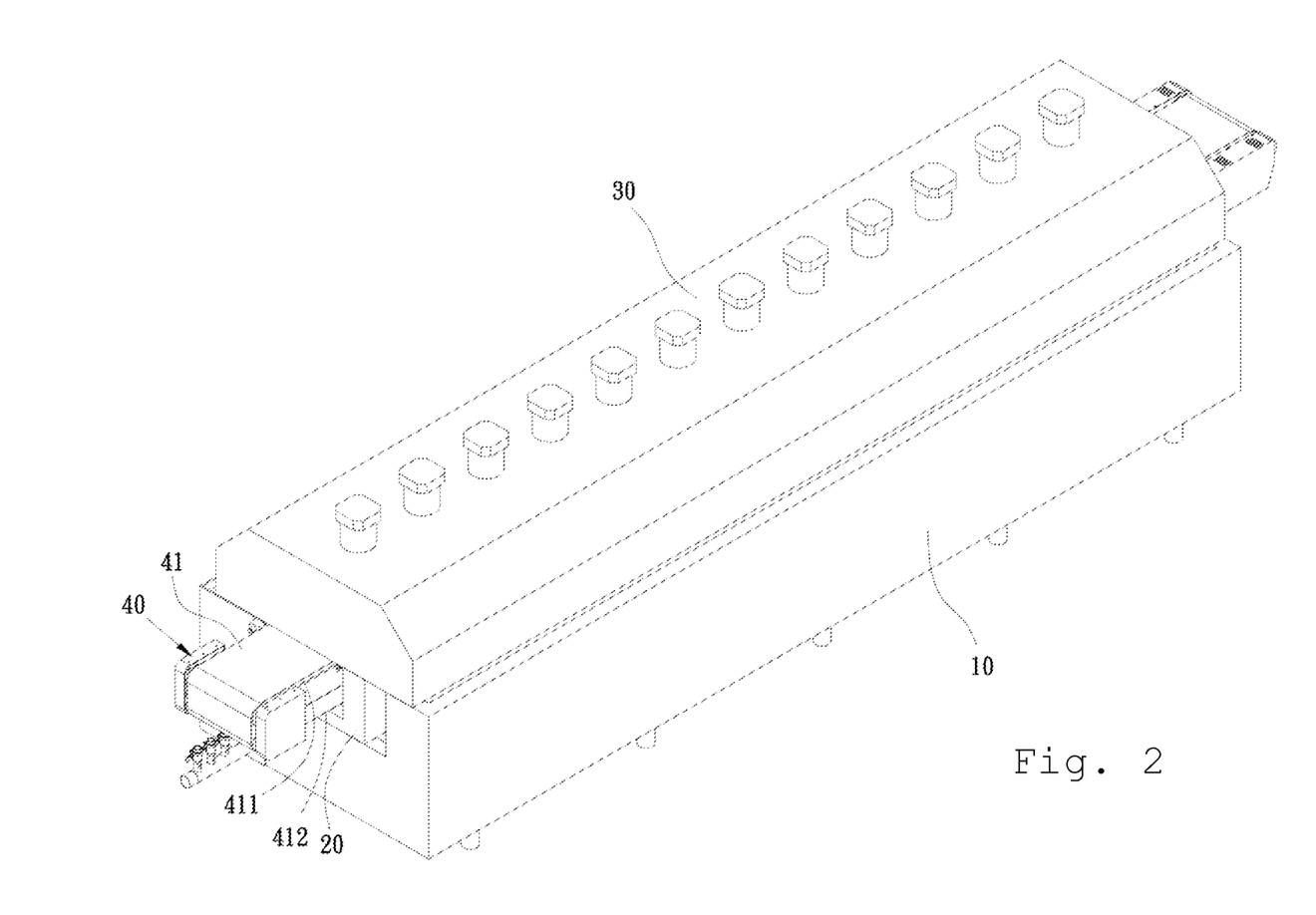
FIG. 2 is a stereoscopic diagram of an embodiment of the present invention.
Figure 3:
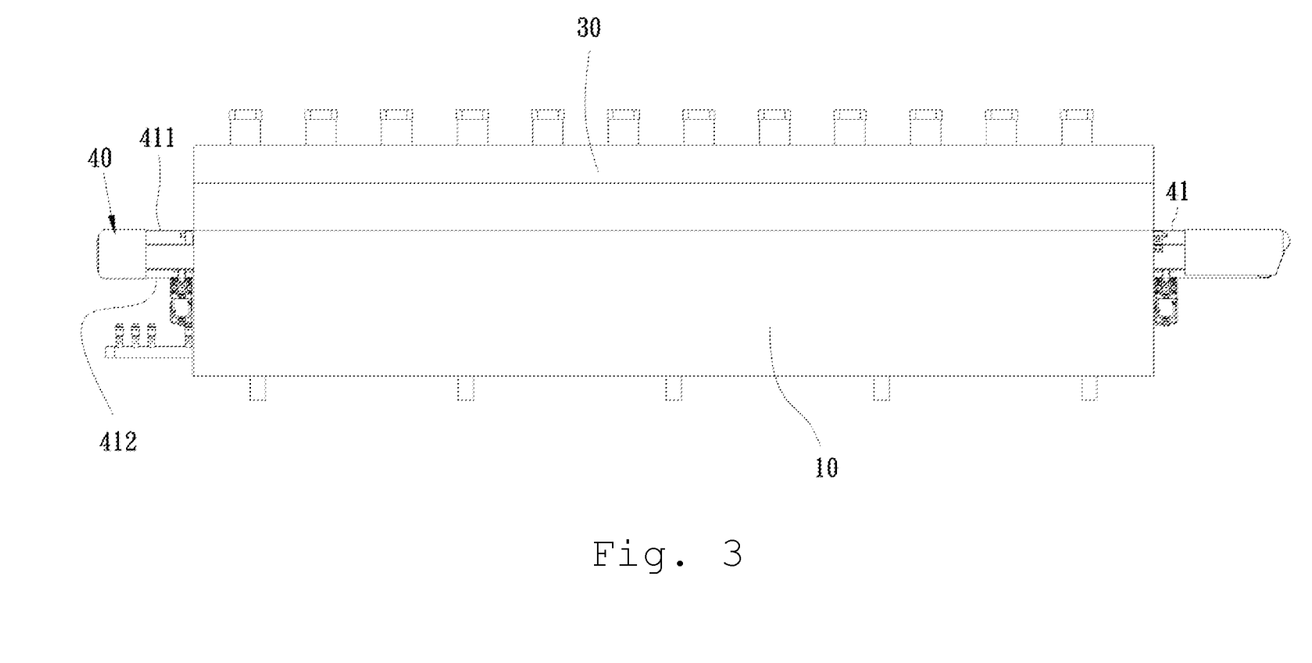
FIG. 3 is a front-view plane diagram of an embodiment of the present invention.
Figure 4:
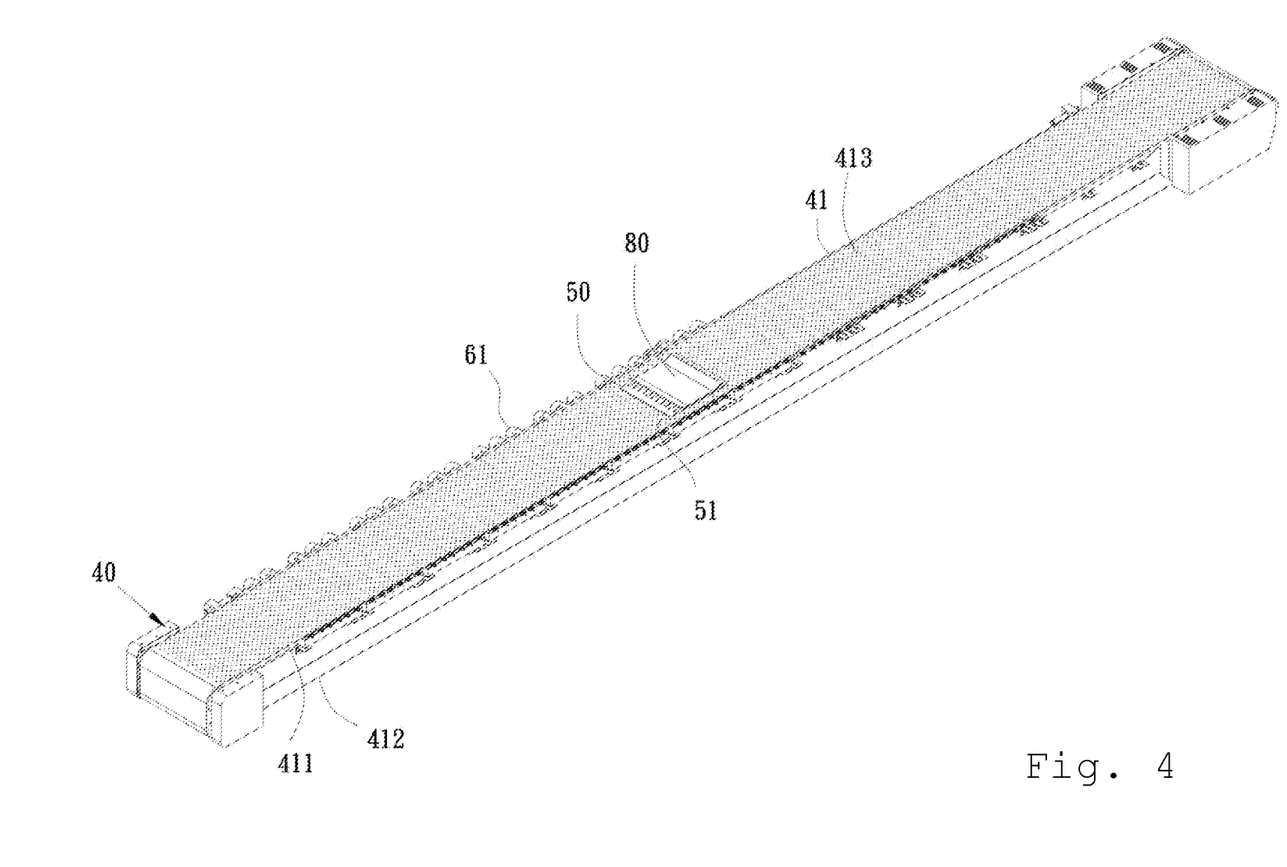
FIG. 4 is a front-view stereoscopic diagram of the perforated steel plate circulating device of an embodiment of the present invention.
Figure 5:
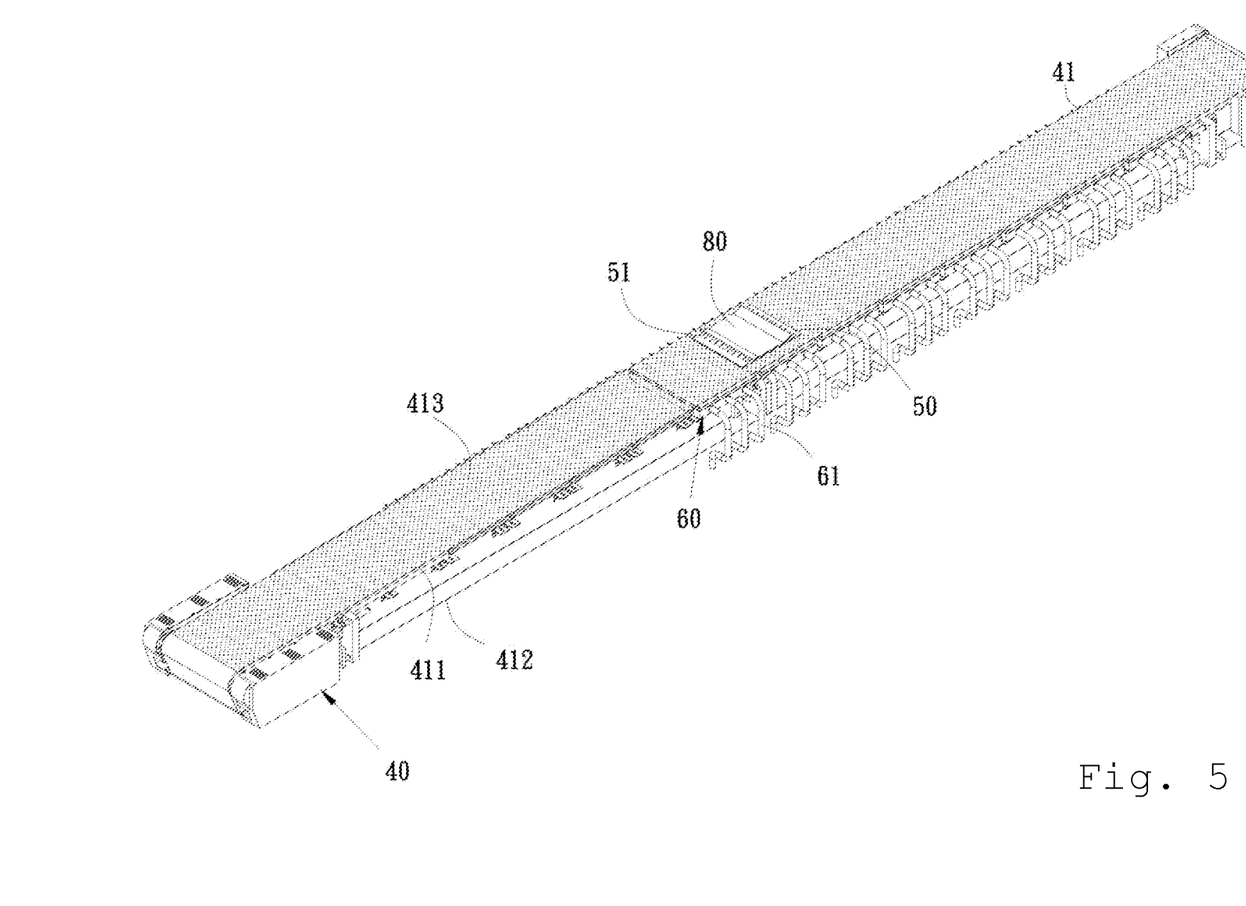
FIG. 5 is a rear-view stereoscopic diagram of the perforated steel plate circulating device of an embodiment of the present invention.
Figure 6:
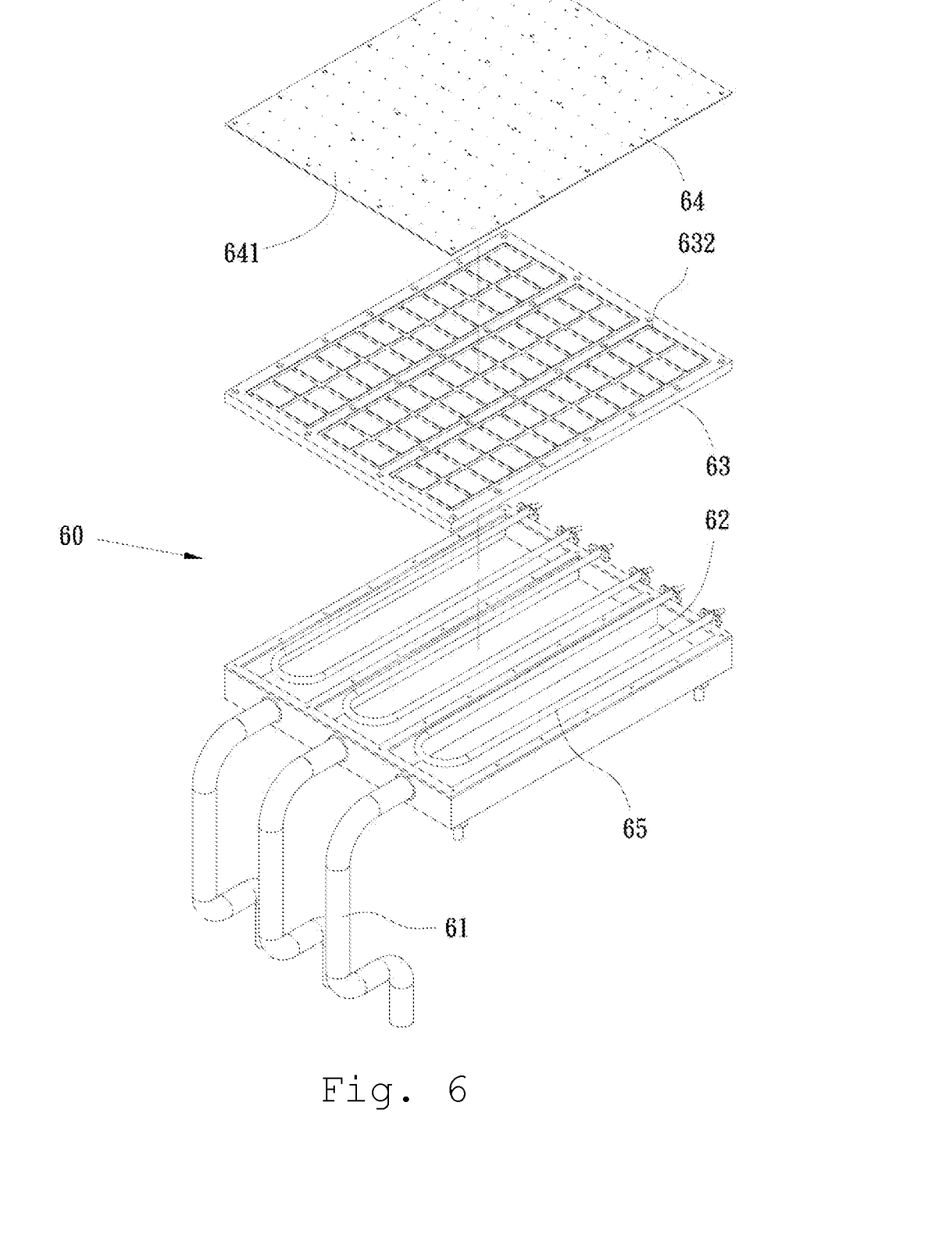
FIG. 6 is an exploded stereoscopic diagram of the downdraft module of an embodiment of the present invention.
Figure 7:
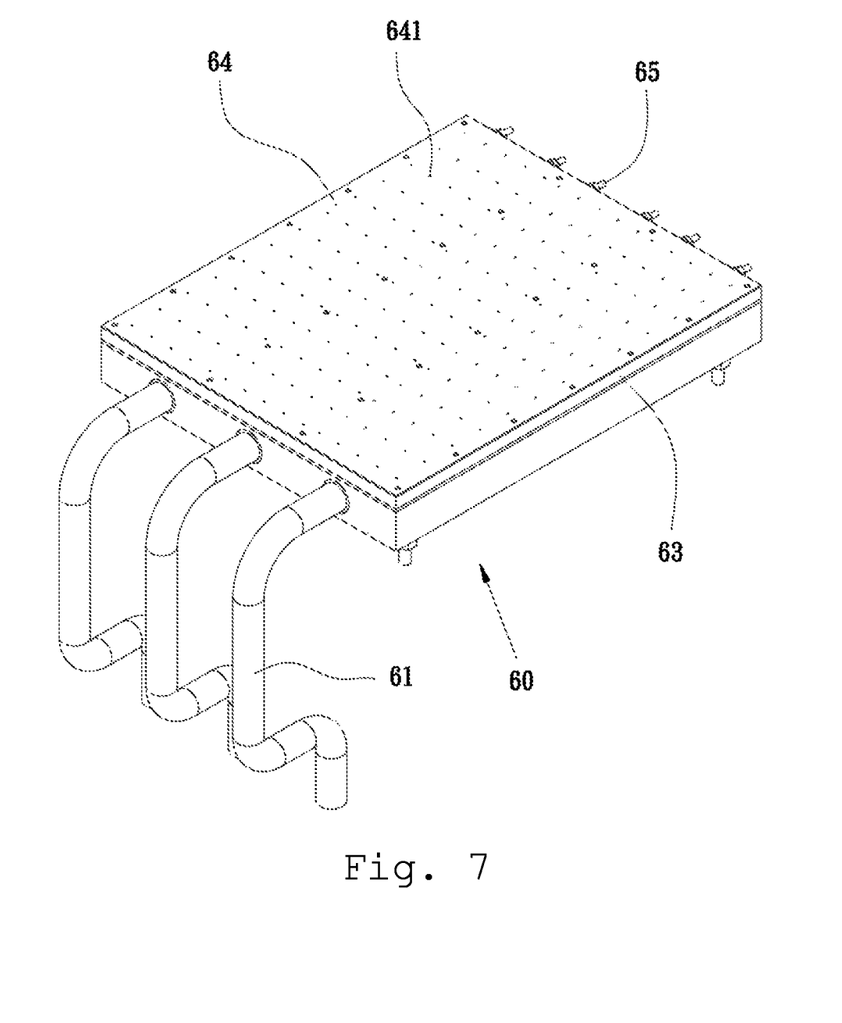
FIG. 7 is a stereoscopic diagram of the downdraft module of an embodiment of the present invention.
Figure 8:
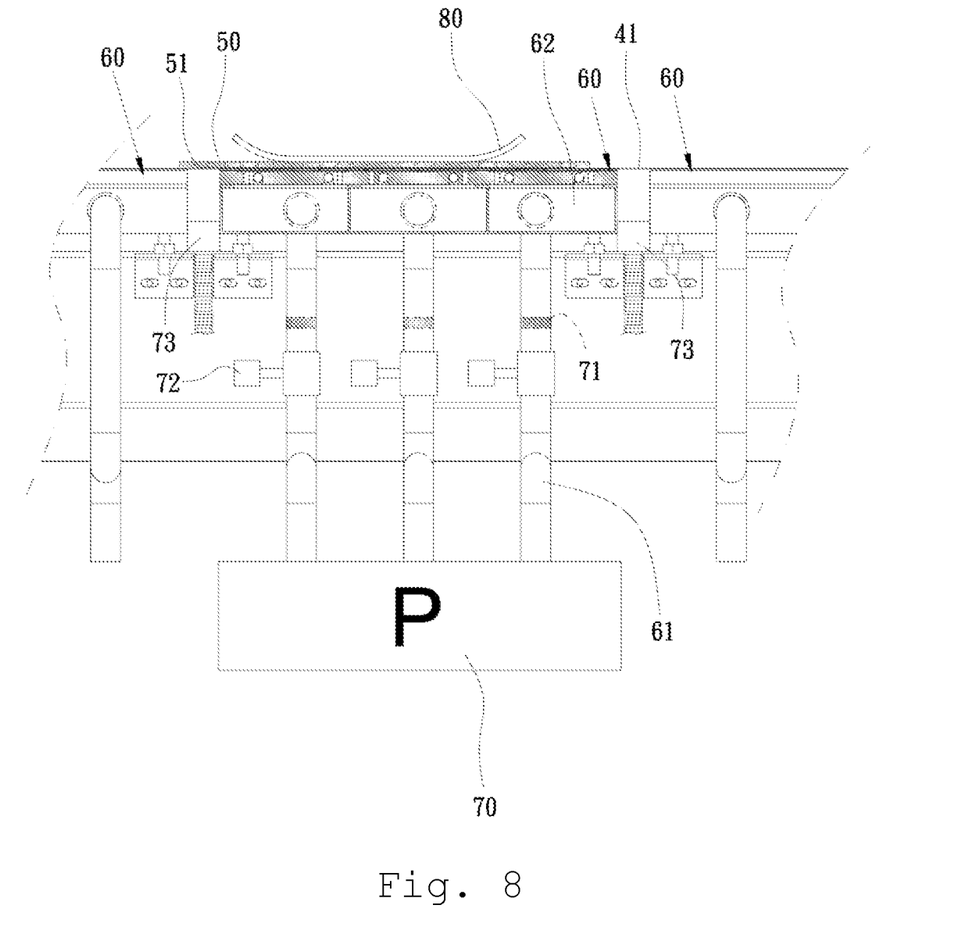
FIG. 8 is a partial section-view plane diagram of an embodiment of the present invention.
Figure 9:
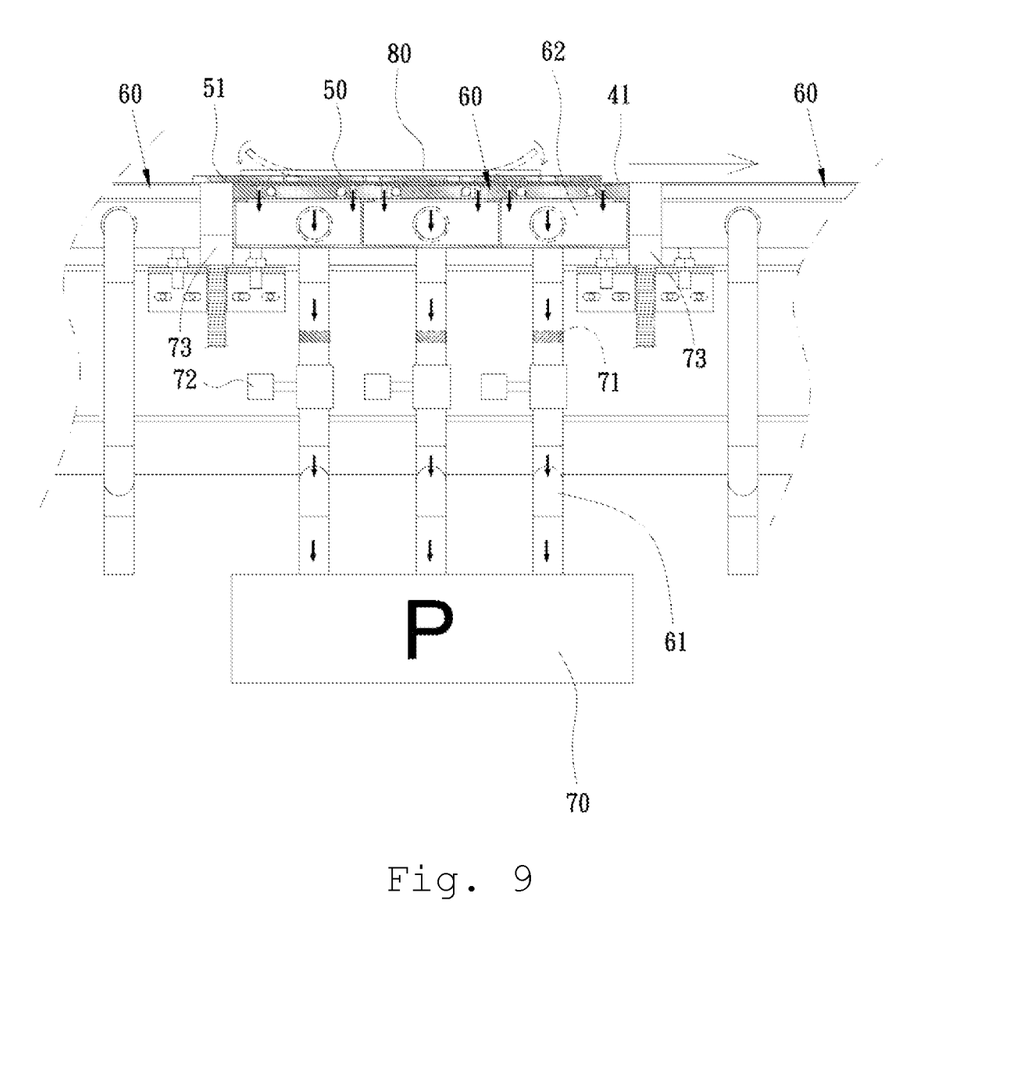
FIG. 9 is a partial section-view plane action diagram of an embodiment of the present invention.

For further understanding and recognition by the review committee, the purposes, characteristics and effects of the present invention are described below in detail in combination with embodiments and drawings:

As shown in FIGS. 1-5, the present invention provides a warpage suppressing reflow oven, which includes:

a reflow oven body 10; a reflow-oven inner oven 20 is disposed in the reflow oven body 10; and an openable reflow-oven upper oven 30 is disposed on the reflow oven body 10. The warpage suppressing reflow oven is characterized in: a perforated steel plate circulating device 40 is disposed at the reflow-oven inner oven 20; the perforated steel plate circulating device 40 includes a perforated steel plate 41; a plurality of through steel plate holes 413 are made in the perforated steel plate 41; the perforated steel plate 41 makes circular conveying actions; the perforated steel plate 41 is looped to form an upper panel 411 and a lower panel 412; a plurality of universal perforated carriers 50 are disposed on the upper panel 411; more than one product 80 is disposed on the universal perforated carriers 50; a plurality of through carrier holes 51 are made in the universal perforated carrier 50; a plurality of downdraft modules 60 are arranged in the perforated steel plate 41; the downdraft modules 60 can generate downdraft acting forces toward the upper panel 411 of the moving perforated steel plate 41, and the downdraft acting forces reach the bottom surfaces of the products 80 via the steel plate holes 413 and the carrier holes 51; more than one air extractor 70 (as shown in FIGS. 8 and 9) is communicated with the plurality of downdraft modules 60 via a plurality of pipelines 61; and the air extractor 70 can be a pump or a blower. Under actuation of the air extractors 70, the downdraft modules 60 generate downdraft acting forces; and the downdraft acting forces can be transferred to the bottom surfaces of the products 80. Accordingly, a plurality of products 80 and a plurality of universal perforated carriers 50 are arranged on the upper panel 411 of the perforated steel plate 41; under actuation of the air extractors 70, the downdraft modules 60, the steel plate holes 413 and the carrier holes 51 generate downdraft acting forces; and the downdraft acting forces adsorb the products 80 so that the products 80 are flatly attached to the universal perforated carriers 50 without warpage in a heating process, thereby effectively improving the yield of reflow soldering operations.

As shown in FIGS. 5-9, in the warpage suppressing reflow oven, more than one independent compartment 62 is disposed in the downdraft module 60; and the more than one independent compartment 62 is respectively communicated with corresponding one of the pipelines 61.

As shown in FIGS. 5-9, in the warpage suppressing reflow oven, an in-built plate 63 is sealed above the independent compartments 62 of the downdraft module 60; a plurality of through holes 632 are made in the in-built plate 63; an outer panel 64 is fixed above the in-built plate 63; a plurality of through plate holes 641 are made in the outer panel 64; and the plate holes 641, the through holes 632 and the independent compartments 62 are communicated with each other.

As shown in FIGS. 5-9, in the warpage suppressing reflow oven, at least one heater 65 is disposed in the downdraft module 60, so as to ensure that the in-built plate 63 and the outer panel 64 are maintained above certain temperature; and the at least one heater 65 is disposed in the independent compartment 62.

As shown in FIGS. 5-9, in the warpage suppressing reflow oven, at least one filter 71 and at least one sensor 72 are disposed between the downdraft module 60 and the air extractor 70, so as to ensure that the pipelines 61 connecting the downdraft module 60 and the air extractor 70 are unblocked to maintain a product adsorption capacity. The filter 71 has an effect of filtering pollutants or can also have a cooling function, and captures volatile pollution gases generated in reflow soldering operations by means of condensation; and the sensor 72 can be a flowmeter or a pressure gauge; the flowmeter is used for sensing a gas flow change of the pipelines 61; or the pressure gauge is used for sensing a gas pressure change of the pipelines 61.

As shown in FIGS. 8 and 9, in the warpage suppressing reflow oven, at least one dust collector 73 is disposed on the inner side of the perforated steel plate circulating device 40; and the at least one dust collector 73 is used for clearing away the dust particles generated by friction between the inner side of the upper panel 411 of the perforated steel plate circulating device 40 and the outer panel 64 of the downdraft module 60.

As shown in FIGS. 1-9, the present invention provides a warpage suppressing reflow oven, where the reflow oven can be divided into a preheating area, a reflow soldering area and a cooling area; the upper panel 411 of the perforated steel plate 41 carriers and conveys universal perforated carriers 50 and products 80 to sequentially pass through the preheating area, the reflow soldering area and the cooling area; and without a downward acting force, the products 80 will deform when passing through the heating area, and the deformation will lead to soldering defects. Therefore, a plurality of downdraft modules 60 are arranged in the perforated steel plate 41; and a plurality of through steel plate holes 413 and through carrier holes 51 are respectively made in the perforated steel plate 41 and the universal perforated carriers 50. By doing so, the downdraft acting forces of the downdraft modules 60 reach the bottom surfaces of the products 80 via the moving steel plate holes 413 and carrier holes 51, so that the products 80 are flatly attached to the universal perforated carriers 50 without warpage and are always kept in a flat state in a mobile heat soldering process, to achieve uniform heating and thus the best soldering effect.

As shown above, the warpage suppressing reflow oven of the present invention is indeed the first of its kind and meets the requirement for novelty of an invention patent; and its overall innovative design meets the requirement for advancement of an invention patent. Moreover, the warpage suppressing reflow oven is equipped with a plurality of downdraft modules that cooperate with air extractors and pipelines to generate downdraft acting forces; the downdraft acting forces are transferred to the bottom surfaces of moving products via the steel plate holes and carrier holes, so that the products are flatly attached to the universal perforated carriers for soldering without deformation, thereby avoiding soldering defects caused by deformation, which meets the requirement for good industrial applicability.

The preferred embodiment of the present invention above is for specific description of the technical characteristics of the present invention. However, those skilled in the art can make changes and modifications to the present invention without departing from the spirit and principles of the present invention; and these changes and modifications shall all be included in the scope of the claims below.

In conclusion, the present invention provides a warpage suppressing reflow oven, which indeed achieves all purposes of the present invention. Moreover, the spatial pattern of its composite structure is unavailable in the products of the same kind, nor is disclosed prior to the application. Thus, the regulations of the patent law are met, and an application is filed in accordance with the law.

BRIEF DESCRIPTION OF SYMBOLS IN THE REPRESENTATIVE DRAWING

10 Reflow oven body
20 Reflow-oven inner oven
30 Reflow-oven upper oven
40 Perforated steel plate circulating device
41 Perforated steel plate
411 Upper panel
412 Lower panel
413 Steel plate hole
50 Universal perforated carrier
51 Carrier hole
60 Downdraft module
61 Pipeline
62 Independent compartment
63 In-built plate
632 Through hole
64 Outer panel
641 Plate hole
65 Heater
70 Air extractor
71 Filter
72 Sensor
73 Dust collector
80 Product

What is claimed is:

1. A warpage suppressing reflow oven, comprising:
a reflow oven body, a reflow-oven inner oven disposed in the reflow oven body, and an openable reflow-oven upper oven disposed on the reflow oven body, wherein:
a perforated steel plate circulating device is disposed at the reflow-oven inner oven; the perforated steel plate circulating device comprises a perforated steel plate; a plurality of through steel plate holes are made in the perforated steel plate; the perforated steel plate makes circular conveying actions; the perforated steel plate is looped to form an upper panel and a lower panel; a plurality of universal perforated carriers are disposed on the upper panel; more than one product is disposed on the universal perforated carriers; a plurality of through carrier holes are made in the universal perforated carrier; a plurality of downdraft modules are arranged in the perforated steel plate; the downdraft modules can generate downdraft acting forces toward a moving upper panel of the perforated steel plate, and the downdraft acting forces reach the bottom surfaces of the products via the steel plate holes and the carrier holes; more than one air extractor is communicated with the plurality of downdraft modules via a plurality of pipelines; under actuation of the air extractors, the downdraft modules generate downdraft acting forces; and the downdraft acting forces can be transferred to the bottom surfaces of the product, so that the products are flatly attached to the universal perforated carriers without warpage.

2. The warpage suppressing reflow oven of claim 1, wherein more than one independent compartment is disposed in the downdraft module; and the more than one independent compartment is respectively communicated with corresponding one of the pipelines.

3. The warpage suppressing reflow oven of claim 2, wherein an in-built plate is sealed above the independent compartments of the downdraft module; a plurality of through holes are made in the in-built plate; an outer panel is fixed above the in-built plate; a plurality of through plate holes are made in the outer panel; and the plate holes, the through holes and the independent compartments are communicated with each other.

4. The warpage suppressing reflow oven of claim 1, wherein at least one heater is disposed in the downdraft module.

5. The warpage suppressing reflow oven of claim 2, wherein at least one heater is disposed in the independent compartment.

6. The warpage suppressing reflow oven of claim 3, wherein at least one heater is disposed in the independent compartment.

7. The warpage suppressing reflow oven of claim 1, wherein at least one filter and at least one sensor are disposed between the downdraft module and the air extractor, so as to ensure that the pipelines connecting the downdraft module and the air extractor are unblocked to maintain a product adsorption capacity.

8. The warpage suppressing reflow oven of claim 7, wherein the sensor can be a flowmeter or a pressure gauge.

9. The warpage suppressing reflow oven of claim 3, wherein at least one dust collector is disposed on an inner side of the perforated steel plate circulating device; and the at least one dust collector is used for clearing away dust particles generated by friction between the inner side of the upper panel and the downdraft module.

10. The warpage suppressing reflow oven of claim 1, wherein the air extractor can be a pump or a blower.

\* \* \* \* \*